United States Patent [19]

Chan

[11] Patent Number: 4,879,250
[45] Date of Patent: Nov. 7, 1989

[54] METHOD OF MAKING A MONOLITHIC INTERLEAVED LED/PIN PHOTODETECTOR ARRAY

[75] Inventor: Eric Y. Chan, Mercer Island, Wash.

[73] Assignee: The Boeing Company, Seattle, Wash.

[21] Appl. No.: 251,134

[22] Filed: Sep. 29, 1988

[51] Int. Cl.⁴ .................. H01L 31/18; H01L 21/20
[52] U.S. Cl. ................................. 437/3; 156/662;
357/19; 357/17; 437/48; 437/54; 437/127;
437/905; 437/974
[58] Field of Search .................. 148/DIG. 51, 56, 65,
148/66, 72, 99, 110, 119, 120, 153, 168, 169,
172; 156/644, 647, 652, 662; 357/16, 17, 19;
350/96.11, 96.12; 437/3, 2, 23, 48, 51, 54, 64,
81, 107, 126, 127, 133, 167, 904, 905, 974, 987

[56] References Cited

U.S. PATENT DOCUMENTS

| | | | |
|---|---|---|---|
| 3,852,798 | 12/1974 | Leabailly et al. | 357/19 |
| 3,914,137 | 10/1975 | Huffman et al. | 357/19 |
| 3,979,587 | 9/1976 | de Cremoux | 357/19 |
| 4,110,781 | 8/1978 | Konishi et al. | 357/39 |
| 4,115,150 | 9/1978 | Dyment | 357/17 |
| 4,136,928 | 1/1979 | Logan et al. | 350/96.11 |
| 4,152,044 | 5/1979 | Liu | 350/96.12 |
| 4,152,713 | 5/1979 | Copeland | 357/19 |
| 4,216,485 | 8/1980 | Page | 357/19 |
| 4,275,404 | 6/1981 | Cassiday et al. | 357/19 |
| 4,284,884 | 8/1981 | Dyment et al. | 250/205 |
| 4,292,512 | 9/1981 | Miller et al. | 250/205 |
| 4,327,962 | 5/1982 | Redman | 350/96.15 |
| 4,477,721 | 10/1984 | Chappell et al. | 357/19 |
| 4,667,212 | 5/1987 | Nakamura | 357/19 |
| 4,675,518 | 6/1987 | Oimura et al. | 250/205 |

FOREIGN PATENT DOCUMENTS

| | | |
|---|---|---|
| 0070234 | 7/1982 | European Pat. Off. . |
| 56-152266 | 11/1981 | Japan . |
| 57-190373 | 11/1982 | Japan . |
| 60-21577 | 2/1985 | Japan . |
| 60-85579 | 5/1985 | Japan . |
| 61-229359 | 10/1986 | Japan . |
| 0037979 | 2/1987 | Japan ................. 357/19 |
| 0119981 | 6/1987 | Japan ................. 357/19 |
| 0065682 | 3/1988 | Japan ................. 357/19 |
| 2094060 | 2/1982 | United Kingdom . |

OTHER PUBLICATIONS

Lee et al., "Dual Wavelength Surface Emitting InGaAsP LEDS", Elec. Lett., 23rd Oct. 1980, vol. 16, No. 22, pp. 845–846.

Stephen Forrest, "Optical Detectors: Three Contenders", *IEEE Spectrum*, pp. 76–84, (May 1986).

Note, "Twelve-Channel Individually Addressable InGaAs/InP p-i-n Photodiode and InGaAsP/InP LED Arrays in a Compact Package", *Journal of Lightwave Technology*, vol. LT-5, No. 8, pp. 1118–1122, (Aug. 1987).

Primary Examiner—Brian E. Hearn
Assistant Examiner—William Bunch
Attorney, Agent, or Firm—Christensen, O'Connor, Johnson & Kindness

[57] ABSTRACT

Interleaved arrays of photoelectronic devices are fabricated utilizing one-step epitaxial growth of all active layers and simple planar processing. Exemplary arrays include interleaved LED transmitters and PIN photodiode receivers that operate at the same wavelength on light that enters the PINs and exits the LEDs along opposite but parallel paths and interleaved arrays of LED transmitters that emit light at two different wavelengths.

9 Claims, 5 Drawing Sheets

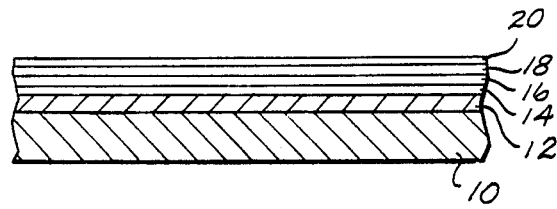
fig.1. EPITAXIALLY GROW InGaAs DETECTOR LAYER AND FOUR LED LAYERS
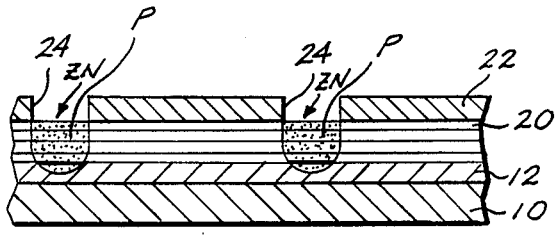
fig.2. DEPOSIT Si₃N₄, OPEN HOLES AND DIFFUSE Zn IN P-REGION OF P-I-N PHOTODIODE
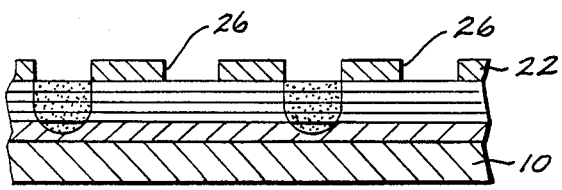
fig.3. OPEN HOLES FOR LED CONTACTS
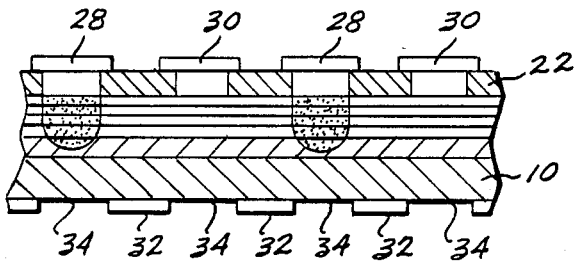
fig.4. DEPOSIT FRONT AND BACK METALIZATION
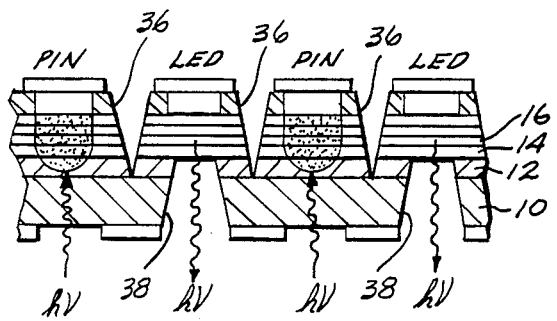
fig.5. PERFORM ISOLATION ETCH AND ETCH LED WINDOWS

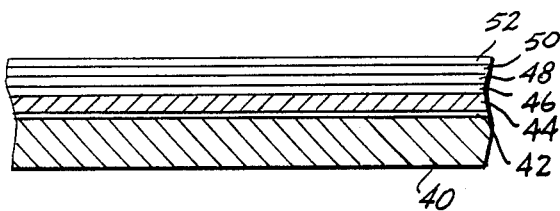
Fig. 6. EPITAXIALLY GROW GaAs "STOP ETCH" WINDOW LAYER, GaAs DETECTOR LAYER AND FOUR LED LAYERS
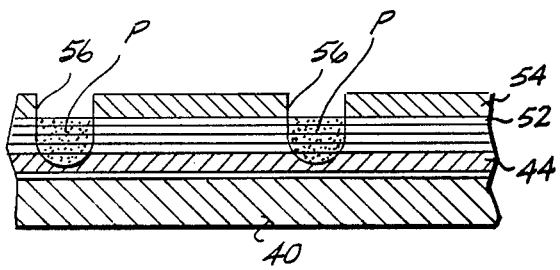
Fig. 7. DEPOSIT $Si_3N_4$, OPEN HOLES, DIFFUSE Zn P-REGION OF P-I-N PHOTODIODE
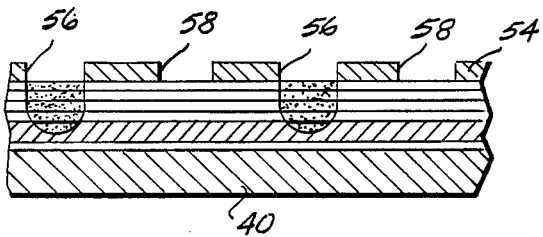
Fig. 8. OPEN HOLES FOR LED CONTACTS

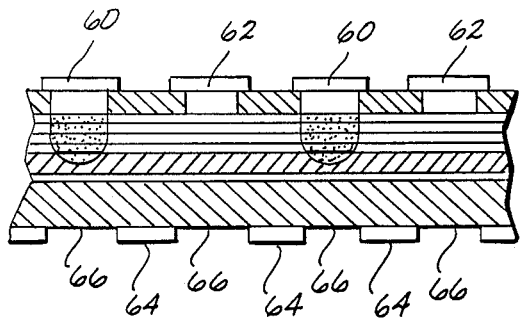
Fig. 9. DEPOSIT FRONT AND BACK METALIZATION
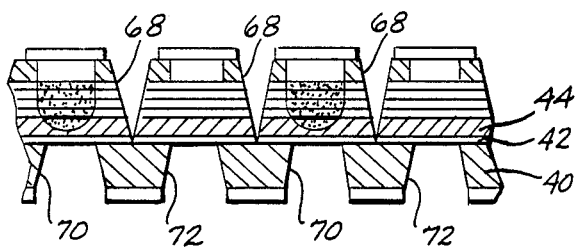
Fig. 10. PERFORM ISOLATION ETCH AND ETCH LED AND P-I-N WINDOWS
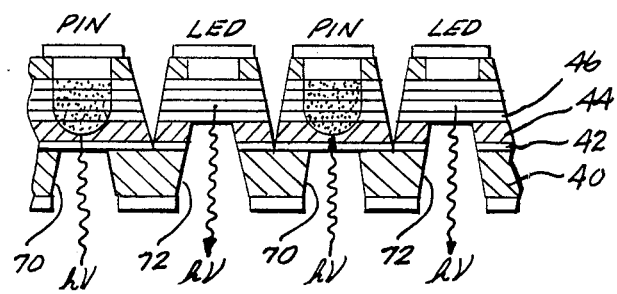
Fig. 11. SELECTIVELY ETCH TO COMPLETE LED WINDOWS

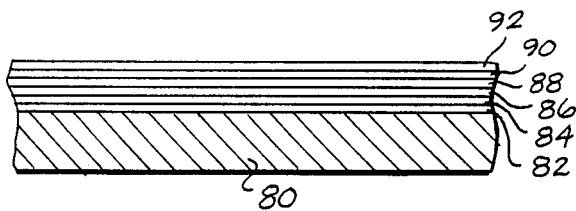
Fig. 12. EPITAXIALLY GROW FOUR LED LAYERS
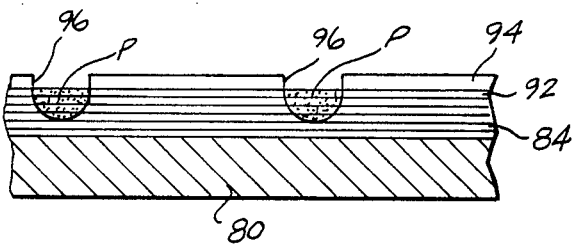
Fig. 13. DEPOSIT $Si_3N_4$, OPEN HOLES AND DIFFUSE Zn P-REGION FOR $\lambda_1$ LED ARRAY
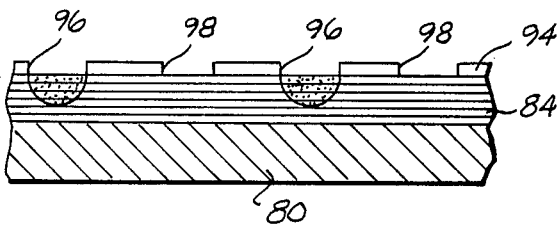
Fig. 14. OPEN HOLES FOR CONTACTS TO $\lambda_2$ LED ARRAY

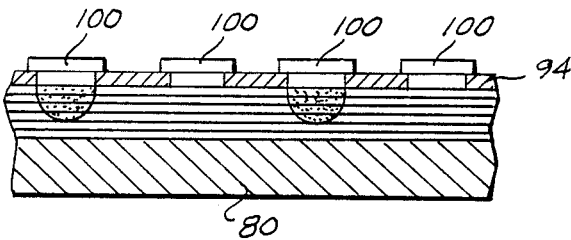
Fig. 15. DEPOSIT METALIZATION FOR P-CONTACTS
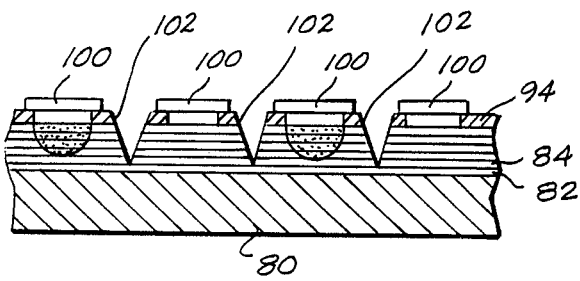
Fig. 16. PERFORM ISOLATION ETCH BETWEEN DEVICES
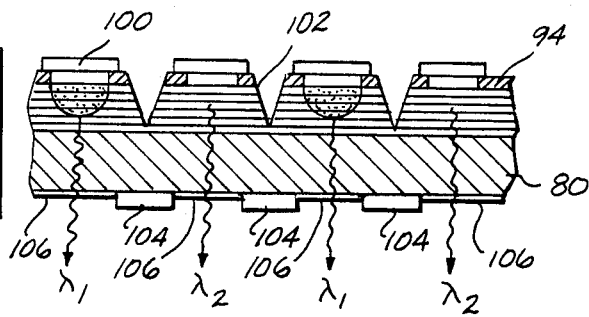
Fig. 17. DEPOSIT BACK OHMIC CONTACTS FOR LED ARRAY AND DEPOSIT $S_3N_4$ ANTI-REFLECTIVE

METHOD OF MAKING A MONOLITHIC INTERLEAVED LED/PIN PHOTODETECTOR ARRAY

BACKGROUND OF THE INVENTION

The present invention broadly relates to integrated optoelectronic photodetector circuits and to fabrication techniques therefor. More particularly, the invention concerns methods for fabricating arrays of photonic devices consisting of alternating light-emitting diodes (LEDs) and PIN photodetectors operable at the same wavelength or alternating LEDs that are operable at two different wavelengths. One-step epitaxial growth of all layers for the active devices and simple planar processing assure high-yield, reproducible fabrication of devices having uniform characteristics.

The development of integrated optical circuits has become the subject of increased interest, especially in the area of fiber optic communications. A number of difficulties have been encountered in these efforts to fabricate different types of active devices next to each other on the same wafer.

Previously employed techniques have utilized selective epitaxial growth and multiple growth runs to integrate LED and PIN structure having different layers of III-V compound materials. Selective epitaxy on the same substrate is very difficult when the LED and PIN spacing in the arrangements is very small. Because of this, an alternative approach has been to fabricate III-V LED layers on a silicon substrate and thereafter use the silicon substrate to form the photodetectors. The problem with this approach is that the large lattice mismatch between the III-V epitaxial layers and the silicon substrate will degrade the LED quality and limit the detector's response to 0.8 micrometers ($\mu$m) wavelength.

A further problem has been the difficulty of optimizing each of the separate components on the wafer. As a result, it has been heretofore necessary to compromise the performance of one or more the components. Where the circuits include PINs, it is usually these components that are compromised.

Nonoptimized PINs may be acceptable for monitoring applications or for use in generating electrical signals for switching, clocking and triggering. However, in a fiber optic communication system the speed and sensitivity of the detector are far more crucial than in these applications. The requirements are especially stringent for integrated emitter/detector systems which operate at 1.3 $\mu$m wavelengths. For these applications, the detector must have low noise so that the system can be operated at a low bit error rate (BER), e.g., BER=$10^{-9}$. The detector must also have a high sensitivity so that it can detect signals having powers less than a microwatt. As well, the detectors must have this sensitivity over a high bandwidth so that they can operate at data rates greater than 200 Mbits per second. To satisfy all of these requirements, the detector must have a dark current ($I_d$)<10 nA (at −10 volts), quantum efficiency (QE)>75% and a capacitance <1 pF (at −10 volts).

SUMMARY OF THE INVENTION

In accordance with the invention there are provided methods for fabricating interleaved arrays of photoelectronic devices in a single growth run and without the use of selective epitaxy. The invention makes possible the fabrication of LED/PIN arrays in which the interleaved transmitters and receivers operate at the same wavelength on light which enters the PINs and exits the LEDs along opposite but parallel paths. The invention further makes possible the fabrication of LED arrays having transmitters that emit light at different wavelengths interleaved in an alternating fashion with one another. By growing all of the epitaxial layers in a single run on a semiconductor substrate which has good lattice match to the epitaxial layers, the final integrated LED and PIN structures retain all of the good characteristics of these devices in their discrete form. These retained characteristics include low dark current, low capacitance, high LED radiance, low LED forward voltage and the like. To further enhance the performance of the arrays, the invention includes techniques for isolating the active devices so that electrical and optical crosstalk are minimized.

In accordance with one embodiment, an interleaved array of LED and PIN devices operating at a 1.3 $\mu$m wavelength are fabricated on an InP substrate using InGaAs as the active detector layer and InGaAsP as the active light-emitting layer. The initial step in this sequence is the growth of the InGaAs detector layer on the InP substrate. Thereafter, in the same growth run, the four layers for the LED structures are grown. These layers are, in sequence, an InP confining layer, the InGaAsP active emitter layer, another InP confining layer and an InGaAsP cap layer. Planar processing is then begun by depositing a layer of silicon nitride. Appropriately sized and spaced holes are then formed through the nitride layer, followed by zinc diffusion to form the p-region for the PIN structures. After the zinc diffusion, additional holes for the LED contacts are opened through the nitride layer. After these holes have been opened, metallization is deposited on the "front" (silicon nitride side) and "back" (InP substrate side) of the wafer. The front metallization is appropriately patterned to form the p-contacts for each of the LED and PIN devices, while the back metallization is patterned to form the n-contacts for the devices and to leave an opening for each device in the array.

Two steps remain for completion of the LED/PIN photodetector array: performing an isolation etch for each device on the array and etching a window for each LED in the array. The isolation etch is performed from the front of the wafer and removes part of the epitaxial layers between devices so that each device in the array is electrically as well as optically isolated. The windows for the LEDs are formed on the back of the wafer by etching a hole through the InP substrate and InGaAs "i" layer up to the first LED layer. In this final process step, a selective etchant is used to remove the InGaAs epitaxial layer.

According to an alternate embodiment of the invention, similar techniques are applied to a GaAs-based system to form interleaved LED/PIN arrays operating at a 0.8 $\mu$m wavelength. In this embodiment GaAs is used for both the substrate and the active detector layer. The LEDs are formed using three GaAlAs layers having differing amounts of aluminum for the active emitter layer and two confining layers together with a GaAlAs cap layer. The steps of forming the p-regions for the PIN diodes with zinc diffusion, application and patterning of the front and back metallization, and isolation etching are similar to the steps used in the first embodiment. The window-etching step is conceptually similar to that of the first embodiment, having as its purpose the opening of windows to each of the PIN and LED devices in the array. However, this second embodiment requires the use of an additional GaAlAs "stop etch" window layer. This layer is epitaxially grown on the GaAs substrate prior to the growth of the GaAs detector layer and four LED layers. In the window-forming step a selective etchant is used so that the etching stops at the GaAlAs "stop etch" window layer over each of the devices in the array. The portions of this layer underlying the PIN detectors are not further etched so that these portions of this layer serve as windows to these devices. The remaining exposed portions of the "stop etch" window layer and the overlying GaAs "i" layer are, however, further etched deep into the first GaAlAs LED layer to form the windows for the LEDs in the array.

According to yet a further embodiment of the invention, an interleaved array of LEDs operating at two different wavelengths is fabricated on an InP substrate. As with the first two embodiments, all of the layers for the active devices are formed in a single epitaxial growth run. The important requirement for this device is to have two active layers incorporated in the epitaxial growth process. The first active layer is a quarternary layer with composition $In_xGa_{1-x}As_yP_{1-y}$ while the second active layer is another quarternary layer with composition $In_aGa_{1-a}As_bP_{1-b}$. By adjusting the composition of these layers (varying x and y in the first active layer and a and b in the second active layer), it is possible to provide the first active layer with an energy gap greater than the energy gap of the second active layer. By also growing the second active layer above the first, the light emitted from the second active layer will not be absorbed by the first. Using this principle together with diffusion on selected contact openings on the surface of the final epitaxial wafer, an interleaved wavelength LED array is fabricated.

BRIEF DESCRIPTION OF THE DRAWINGS

FIGS. 1-5 are diagrammatic, cross-sectional views of an interleaved LED/PIN array being fabricated in accordance with the invention, together with a flow chart describing steps within the fabrication process.

FIGS. 6-11 are diagrammatic, cross-sectional views of an interleaved LED/PIN array being fabricated in accordance with an alternative embodiment of the invention, together with a flow chart describing steps within the fabrication process.

FIGS. 12-17 are diagrammatic, cross-sectional views of an interleaved array of different wavelength LEDs being fabricated in accordance with a second alternative embodiment of the invention, together with a flow chart describing steps within this alternative fabrication process.

DETAILED DESCRIPTION OF THE PREFERRED EMBODIMENT

Referring to FIGS. 1-5, an array of interleaved LEDs and PIN photodiodes emitting and detecting light at 1.3 μm wavelength is fabricated with InP-based materials. The process begins with a heavily doped n-type InP substrate or wafer 10 having a thickness of about 100 μm. As illustrated in FIG. 1, an InGaAs detector layer 12 is epitaxially grown on the InP substrate to a thickness of about 4 μm. The doping of this active detector layer, the so-called "intrinsic" or "i" layer, is kept relatively low, to a range of about mid-$10^{15}$ cm$^{-3}$.

The preferred alloy for the active detector layer 12 is $In_{0.53}Ga_{0.47}As$. This photoconductor is selected for three reasons. First, the alloy has a bandgap that is responsive to 1.3 μm photons. Second, this material has electron mobility that is higher than other alloys of the same family, e.g. InGaAsP. Higher mobility gives rise to shorter transit time of the photogenerated electrons in the depletion region of the detector, thus providing the detector with a higher response speed. Third, $In_{0.53}Ga_{0.47}As$ has good lattice match to the InP substrate so that the active layer in the PIN detector has fewer defects. As a consequence, the resulting PIN detectors have long life and reliability.

The 4 μm thickness for the active layer is determined from the reciprocal of the absorption coefficient of the active layer at the operating wavelength, i.e., at 1.3 μm. This active layer thickness insures that all signal photons will be absorbed in the depletion region of the PIN detector. Therefore, the loss of signal photons is minimized and the quantum efficiency of the detector is high.

Referring again to FIG. 1, the four layers for the LED structures are grown on top of the InGaAs intrinsic layer 12. To enhance performance, reliability and uniformity between devices, the InGaAs detector layer and four LED layers are preferably grown in a single run. As shown in FIG. 1, the four epitaxial layers for the LEDs are, in sequence beginning with the layer on top of the InGaAs detector layer 12, an n-type InP buffer layer, or confining layer 14, an InGaAsP active emitter layer 16, a p-type InP confining layer 18, and a p-type InGaAsP cap layer 20. Each of the four LED layers 14, 16, 18 and 20 has a thickness of about 1 μm.

After completion of the epitaxial growth steps, the photodetector array is completed using conventional planar processing techniques in the sequence illustrated in FIGS. 2-5. Referring for a moment to FIG. 5, the process here described produces a generally linear array of LEDs and PIN photodiodes that are arranged in alternating manner next to one another. Advantageously, the array architecture and constituent materials are selected so that the LEDs and PIN photodiodes emit and detect light at the same wavelength, here 1.3 μm, along parallel paths. That is to say, the PIN and LED devices are arranged so that the PIN photodiodes receive light traveling in the opposite direction to the light emitted by the LEDs and along a path that is parallel to the path of the LED emissions.

Referring now to FIG. 2, the planar processing begins with the deposition of a silicon nitride layer 22 on the cap layer 20. Thereafter, holes 24 having a diameter of about 90 μm and spaced approximately 1000 to 500 μm apart are formed. Zinc is then diffused deep into the structure to form the p-region for the PIN structure, i.e., zinc is diffused deep enough to go partially into the InGaAs detector layer 12. This p-region is schematically illustrated by the stippled portions of the structure designated "p" in FIG. 2. After the zinc diffusion to form the p-regions for the PIN detectors, holes 26 for the LED contacts are opened through the silicon nitride layer. For the embodiment under description, the holes are about 25 μm in diameter and are spaced approximately 1000-500 μm from one another at positions that lie at the midpoints between the p-regions formed by the zinc diffusion. This arrangement is illustrated in FIG. 3.

Referring now to FIG. 4, metallization is deposited on the "front" and "back" of the wafer. For ease of description, the term "front" is used here to refer to the side of the wafer having the silicon nitride layer 22 and holes 26, while the term "back" is used to refer to the exposed surface of the InP substrate 10 that lies opposite the "front" of the wafer.

Using conventional photolithographic processing, the front metallization is patterned to form individual p-contacts 28 for the PIN photodiodes and individual p-contacts 30 for the LEDs. The back metallization is also appropriately patterned to form n-contacts 32 for each of the devices. As shown in FIG. 4, the patterning of the back metallization and the arrangement of the n-contacts 32 is such as to leave an opening 34 for each device in the array.

In the next step, as illustrated in FIG. 5, an isolation etch is performed between each of the devices from the front of the wafer. The purpose of this isolation etch is to electrically and optically isolate each device in this array. For this purpose, the etching is performed sufficiently deep into the wafer to remove a portion of each of the epitaxial layers from between each device in the array; i.e., etching is performed through the silicon nitride layer 22, the four LED layers 14, 16, 18 and 20, and the detector layer 12 to the "upper" surface of the substrate 10. As illustrated in FIG. 5, this process forms v-shaped grooves 36 between the active components of the array.

Following the isolation etch, a window 38 is formed on the back of the InP substrate 10 for each LED in the array. This is accomplished by etching a hole through the InP substrate 10 and InGaAs detector layer 12 up to the first LED layer, i.e., up to the n-type InP buffer layer 14. It will be readily appreciated that a selective etchant is used in this window-forming procedure to remove the desired portions of the InGaAs intrinsic layer 12.

An alternative sequence for fabricating an interleaved LED/PIN photodetector array is illustrated in FIGS. 6–11. This procedure utilizes a GaAs-based system of materials to form an interleaved LED/PIN array operating at a 0.8 $\mu$m wavelength. This method starts with a heavily doped n-type GaAs substrate, or wafer, 40 instead of the InP substrate used in the process discussed with reference to FIGS. 1–5. The substrate 40 is heavily doped n-type GaAs and has a thickness of about 100 $\mu$m. Onto this substrate there is epitaxially grown a GaAlAs "stop etch" window layer 42. This layer is approximately 1 $\mu$m thick and is formed of GaAlAs alloy having approximately 30% aluminum. Following the growth of this "stop etch" window layer, all of the layers for the active devices are epitaxially grown. As with the first embodiment of the invention, it is preferred to grow all of these layers as well as the initial "stop etch" window layer 42 in a single run.

The first formed active layer is an approximately 4 $\mu$m GaAs detector layer or intrinsic or "i" layer 44, which has doping in the mid-$10^{15}$ cm$^{-3}$ range. On top of the detector layer 44, four layers for the LEDs are grown. These four layers are, in sequence beginning with the first grown layer, an n-type GaAlAs approximately 25% Al) buffer layer 46, a GaAlAs (approximately 0.05% Al) active emitter layer 48, a p-type GaAlAs (approximately 25% Al) confining layer 50, and a p-type GaAs cap layer 52. Each of the layers is about 1 $\mu$m thick so that the overall thickness of the LED layers is about 4 $\mu$m. The arrangement of these layers is shown in FIG. 6.

Following this epitaxial growth sequence, zinc diffusion to form the p-region for the PIN photodiodes is carried out using the same techniques used for the zinc diffusion in the procedure described in conjunction with FIGS. 1–5. This involves depositing a layer 54 of silicon nitride on top of the cap layer 52, opening holes 56 through the nitride layer, followed by diffusion of zinc partially into the GaAs intrinsic layer 44 to form the p-regions shown as the shaded areas designated "p" in FIG. 7. With a 1 $\mu$m thickness for each of the LED layers and a 4 $\mu$m thickness for the detector layer 44, the zinc is diffused approximately 5 to 6 $\mu$m into the wafer.

After the zinc diffusion, holes 58 approximately 25 $\mu$m in diameter and spaced approximately 1000 to 500 $\mu$m apart at points equidistantly between the holes 56 and just-formed p-regions are opened through the nitride layer 54 to begin the formation of the p-contacts for the LEDs. This procedure produces the structure shown in FIG. 8.

In the next step, a procedure similar to that used in the first embodiment is used to deposit and appropriately pattern metallization on the "front" and "back" of the wafer. The terms "front" and "back" are again arbitrarily used for reference to identify the silicon nitride side and exposed GaAs substrate side, respectively, of the wafer. This metallization procedure produces the p-contacts 60 for each of the PIN diodes, p-contacts 62 for each of the LEDs, and n-contacts 64 for each of the devices on the "back" of the wafer. The n-contacts 64 are arranged to leave an opening 66 in the back metallization for each device in the array.

As illustrated in FIG. 10, following the front and back metallization, an isolation etch is performed on the front of the wafer to provide v-shaped grooves 68 that electrically and optically isolate each device in the array. To achieve this purpose, the isolation etching is performed sufficiently deep into the wafer to remove portions of each of the epitaxial layer between each of the devices.

Following the isolation etch, further etching is performed on the "back" of the wafer to open windows 72 for each LED in the array and windows 70 for each PIN photodiode in the array. This window-opening etch is to be contrasted with the window-opening etch procedure of the first embodiment, as illustrated in FIG. 5, where windows 38 are opened only for the LEDs and not for the PIN devices. In the procedure of the second embodiment now under discussion, a selective etchant is used so that the etching stops at the GaAlAs "stop etch" window layer 42 (see FIG. 10). The portion of this layer underlying the PIN photodiodes is not further etched. However, since this layer is formed from GaAlAs, it has a larger energy gap than the GaAs active detector layer 44. Thus, 0.8 $\mu$m wavelength photons can penetrate through the window formed by this layer and be absorbed in the GaAs "i" layer 44.

As shown in FIG. 11, after forming windows on the "back" of the substrate for the PIN devices, further selective etching is performed to extend the LED windows 72 deeper into the substrate; that is, the etching is performed through the GaAlAs "stop etch" window layer 42, the GaAs detector layer 44, and into the first LED layer, i.e., the n-type GaAlAs buffer layer 46. At the conclusion of this step, the LED/PIN array has the completed form shown in FIG. 11.

According to an additional embodiment of the invention, an interleaved array of LEDs operating at two different wavelengths is fabricated using the sequence illustrated in FIGS. 12-17. This procedure utilizes an InP-based system of materials to form an interleaved array of LEDs operating at a first LED wavelength $\lambda_1$, e.g., 1.1 μm and a second LED wavelength $\lambda_2$, e.g. 1.3 μm. This process begins with a heavily doped n-type InP substrate or wafer 80 having a (100) orientation. As illustrated in FIG. 12, six layers are grown on top of the InP substrate 80 in a single epitaxial growth run. The first layer grown on the InP substrate is an n-type InP buffer layer 82 having a thickness of about 2 μm. The next grown layer 84 is the first quarternary, or active, layer for the first set of LEDs that produce the $\lambda_1$ wavelength emission. This layer is about 1 μm thick and an n-type material having a composition $In_xGA_{1-x}As_yP_{1-y}$. The third layer is an n-type InP confining layer 86 that has grown to a thickness of about 0.5μ. The fourth layer is the second quarternary, or active, layer 88 for the LEDs operating at the second wavelength $\lambda_2$. This layer is grown to a thickness of about 1μ and has the composition $In_aGa_{1-a}As_bP_{1-b}$.

The fifth layer is a p-type InP confining layer 90 for the second active layer 88 and has a thickness of about 0.5 μm. The sixth or final layer is a cap layer 92 with composition $In_cGa_{1-c}As_dP_{1-d}$ and a thickness of about 0.5 μm. The function of this layer is to provide a good ohmic contact for the LED arrays.

After completion of the epitaxial growth steps, the array is completed using conventional planar processing techniques. This planar processing begins with the deposition of a silicon nitride layer 94 on top of the cap layer 92. Thereafter, as illustrated in FIG. 13, a first set of holes 96 having a diameter of about 25 μm and spaced approximately 500 μm apart are opened through the silicon nitride layer. These holes are for the $\lambda_1$ LED arrays. Zinc is then diffused down to the first active layer 84 to form the p-region designated "p" in FIGURE 13, for each of the $\lambda_1$ wavelength LEDs in the first array. Following zinc diffusion, a second set of holes 98 is formed through the nitride layer 94 at positions that lie at the midpoints between the holes 96 and p-regions formed by the zinc diffusion. These second holes 98 are for the contacts to the LEDs in the $\lambda_2$ wavelength array. The structure at this juncture in the fabrication sequence is as shown in FIG. 14.

After all openings have been formed on the top of the nitride layer, metallization is deposited on the "front" of the wafer. The term "front" is used here to refer to the side of the wafer having the silicon nitride layer 94, while the term "back" is used to refer to the exposed surface of the InP substrate 80 that lies opposite the "front" of the wafer. Using conventional photolithographic processing, the front metallization is patterned to form individual p-contacts 100 to each device in the array. Following formation of the p-contacts, an isolation etch is performed between each of the devices to provide electrical and optical isolation. To this end, the etching is performed deep into the epitaxial layers through and including the first active layer 84 down to the InP buffer layer 82. As shown in FIG. 16, this process forms v-shaped grooves 102 between each component in the array.

Following the isolation etch, ohmic contacts 104 for the LEDs are formed on the back of the substrate 80 by depositing and suitably patterning a metallic material. To maximize the LED light output, an anti-reflective coating 106 for each of the LEDs is formed by depositing silicon nitride in the openings that were left as a result of the formation of the ohmic contacts. At the conclusion of this step, the completed array has the structure illustrated in FIG. 17.

While the invention has been described with reference to a preferred embodiment, it will be understood by those skilled in the art that various changes can be made therein without departing from the spirit and scope of the invention.

The embodiments of the invention in which an exclusive property or privilege is claimed are defined as follows:

1. A process for fabricating an integrated optical device, comprising the steps of:
   in a single epitaxial growth operation and in succession on a substrate, growing an intrinsic layer, a first confining layer, an active light emitting layer, a second confining layer, and a cap layer;
   depositing an insulating layer on said cap layer;
   opening a plurality of first holes through said insulating layer to said cap layer;
   diffusing a conductivity effecting material through said first holes into said intrinsic layer;
   opening a plurality of second holes through said insulating layer to said cap layer;
   forming first and second metal p-contacts on said insulating layer, one of said first metal p-contacts being formed through each of said first holes, one of said second metal p-contacts being formed through each of said second holes;
   forming metal n-contacts on a side of said substrate that lies opposite said insulating layer, said metal n-contacts being arranged to leave portions of said substrate exposed, one of said exposed portions lying opposite each of said first and second metal p-contacts;
   etching an isolation groove between each of said first and second metal p-contacts, said grooves extending into said intrinsic layer; and
   etching windows through said substrate and said intrinsic layer to said first confining layer, one of said windows being etched opposite each of said second metal p-contacts.

2. The process of claim 1, wherein said substrate is formed of InP, said intrinsic layer is formed of InGaAs, said first and second confining layers are formed of InP, said active light emitting layer is formed of InGaAsP, and said cap layer if formed of InGaAsP.

3. The process of claim 1, wherein, before growing the intrinsic layer, a window layer is grown on said substrate and wherein said step of etching windows comprises:
   etching PIN windows through said substrate to said window layer, one of said PIN windows being etched opposite each of said first metal p-contacts; and
   etching LED windows through said substrate, said window layer, and said intrinsic layer to said first confining layer.

4. The process of claim 3, wherein said substrate is formed of GaAs, said window layer if formed of GaAlAs, said intrinsic layer is formed of GaAs, and said first and second confining layers and said active light emitting layer are each formed of $Ga_{1-x}Al_xAs$, where $0 < x \leq 1$.

5. The process of claim 4, wherein:
   said first and second confining layers are formed of $Ga_{0.75}Al_{0.25}As$; and said active light emitting layer is formed of $Ga_{0.95}Al_{0.05}As$.

6. A process for fabricating an integrated optical device, comprising the steps of:
- in a single epitaxial growth operation and in succession on a substrate, growing a first confining layer, a first light emitting layer, a second confining layer, a second light emitting layer, a third confining layer, and a cap layer;
- depositing an insulating layer on said cap layer;
- opening a plurality of first holes through said insulating layer;
- diffusing a conductivity effecting material through said first holes into said first light emitting layer;
- opening a plurality of second holes through said insulating layer to said cap layer;
- forming first and second metal p-contacts on said cap layer, one of said first metal p-contacts being formed through each of said first holes, one of said second p-metal contacts being formed through each of said second holes;
- forming metal n-contacts on a side of said substrate that lies opposite said insulating layer, said metal n-contacts being arranged to leave portions of said substrate exposed, one of said exposed portions lying opposite each of said first and metal p-contacts; and
- etching an isolation groove between each of said first and second metal p-contacts, said grooves extending into said first confining layer.

7. The process of claim 6, wherein said substrate and said first and second light emitting layers are each formed of a Group IIIA-VA compound.

8. The process of claim 7, wherein said first light emitting layer is formed of a first quarternary Group IIIA-VA compound and said second light emitting layer is formed of a second quarternary Group IIIA-VA compound, the constituent elements in said first and second quarternary Group IIIA-VA compounds being the same, the properties of said constituent elements being different whereby said first and second light emitting layers emit photons having different wavelengths.

9. The process of claim 8, wherein said first quarternary Group IIIA-VA compound is $In_xGa_{1-x}As_yP_{1-y}$, where $0 < x \leq 1$ and $0 < y \leq 1$, and wherein said second quarternary Group IIIA-VA compound is $In_aGa_{1-a}As_bP_{1-b}$, where $0 < a \leq 1$ and $0 < b \leq 1$.

* * * * *

UNITED STATES PATENT AND TRADEMARK OFFICE
CERTIFICATE OF CORRECTION

PATENT NO. : 4,879,250

DATED : November 7, 1989

INVENTOR(S) : Eric Y. Chan

It is certified that error appears in the above-identified patent and that said Letters Patent is hereby corrected as shown below:

Column 8, line 61, "if" should be --is--

Column 10, line 16, "properties" should be --proportions--

Column 10, line 20, delete "in"

Signed and Sealed this

Seventh Day of May, 1991

Attest:

HARRY F. MANBECK, JR.

*Attesting Officer*  *Commissioner of Patents and Trademarks*